(12) United States Patent
Han et al.

(10) Patent No.: US 8,898,539 B2
(45) Date of Patent: Nov. 25, 2014

(54) CORRECTING ERRORS IN MISCORRECTED CODEWORDS USING LIST DECODING

(75) Inventors: Yang Han, Sunnyvale, CA (US); Shaohua Yang, San Jose, CA (US); Zongwang Li, San Jose, CA (US); Fan Zhang, Milpitas, CA (US); Anatoli A. Bolotov, San Jose, CA (US); Mikhail I. Grinchuk, San Jose, CA (US); Paul G. Filseth, Los Gatos, CA (US); Lav D. Ivanovic, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 211 days.

(21) Appl. No.: 13/611,158

(22) Filed: Sep. 12, 2012

(65) Prior Publication Data

US 2014/0075264 A1 Mar. 13, 2014

(51) Int. Cl.
*H03M 13/00* (2006.01)

(52) U.S. Cl.
USPC ............. 714/758; 714/E11.032; 714/E11.034

(58) Field of Classification Search
USPC ......................................................... 714/758
See application file for complete search history.

(56) References Cited

U.S. PATENT DOCUMENTS

| | | | |
|---|---|---|---|
| 2007/0174755 A1* | 7/2007 | Lee et al. ....................... | 714/762 |
| 2010/0031124 A1* | 2/2010 | Shinagawa et al. ........... | 714/777 |
| 2010/0281340 A1* | 11/2010 | Franceschini et al. ........ | 714/763 |
| 2011/0307748 A1* | 12/2011 | Laisne ........................... | 714/726 |
| 2012/0005552 A1* | 1/2012 | Gunnam ........................ | 714/752 |
| 2012/0331338 A1* | 12/2012 | Cho ............................... | 714/6.24 |
| 2013/0007554 A1* | 1/2013 | Chen et al. .................... | 714/752 |
| 2013/0055050 A1* | 2/2013 | Uchikawa ...................... | 714/781 |
| 2013/0111295 A1* | 5/2013 | Li et al. ......................... | 714/755 |

OTHER PUBLICATIONS

Authors: D.K. Pradhan and J.J Stiffler; Title: Error-Correcting Codes and Self-Checking Circuits; Published Date: Mar. 1980; Published: IEEE Computer.*

* cited by examiner

*Primary Examiner* — April Y Blair
*Assistant Examiner* — Thien D Nguyen
(74) *Attorney, Agent, or Firm* — Hamilton DeSanctis & Cha

(57) ABSTRACT

A receive path of a communications system comprises an error-correction decoder, an error-detection decoder, and a codeword adjuster. The error-correction decoder performs error-correction decoding on a received codeword to generate a valid codeword. The error-detection decoder performs error-detection decoding on the valid codeword to determine whether or not the valid codeword is the correct codeword that was transmitted. If the valid codeword is not the correct codeword, then the codeword adjuster generates an adjusted valid codeword by applying an error vector to the valid codeword. The error-detection decoder performs error-detection decoding on the adjusted valid codeword to determine whether or not the adjusted valid codeword is the correct codeword. When the error-correction decoder generates an incorrect valid codeword, adjusting the valid codeword enables the receive path to recover the correct codeword without retransmitting or re-detecting the codeword.

17 Claims, 2 Drawing Sheets

CORRECTING ERRORS IN MISCORRECTED CODEWORDS USING LIST DECODING

The subject matter of this application is related to U.S. patent application Ser. No. 12/675,981 filed on Mar. 2, 2010 and U.S. patent application Ser. No. 12/677,322 filed Mar. 10, 2010, the teachings of all of which are incorporated herein by reference in their entirety.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

Embodiments of the invention will become more fully apparent from the following detailed description, the appended claims, and the accompanying drawings.

DETAILED DESCRIPTION

Figure 1:
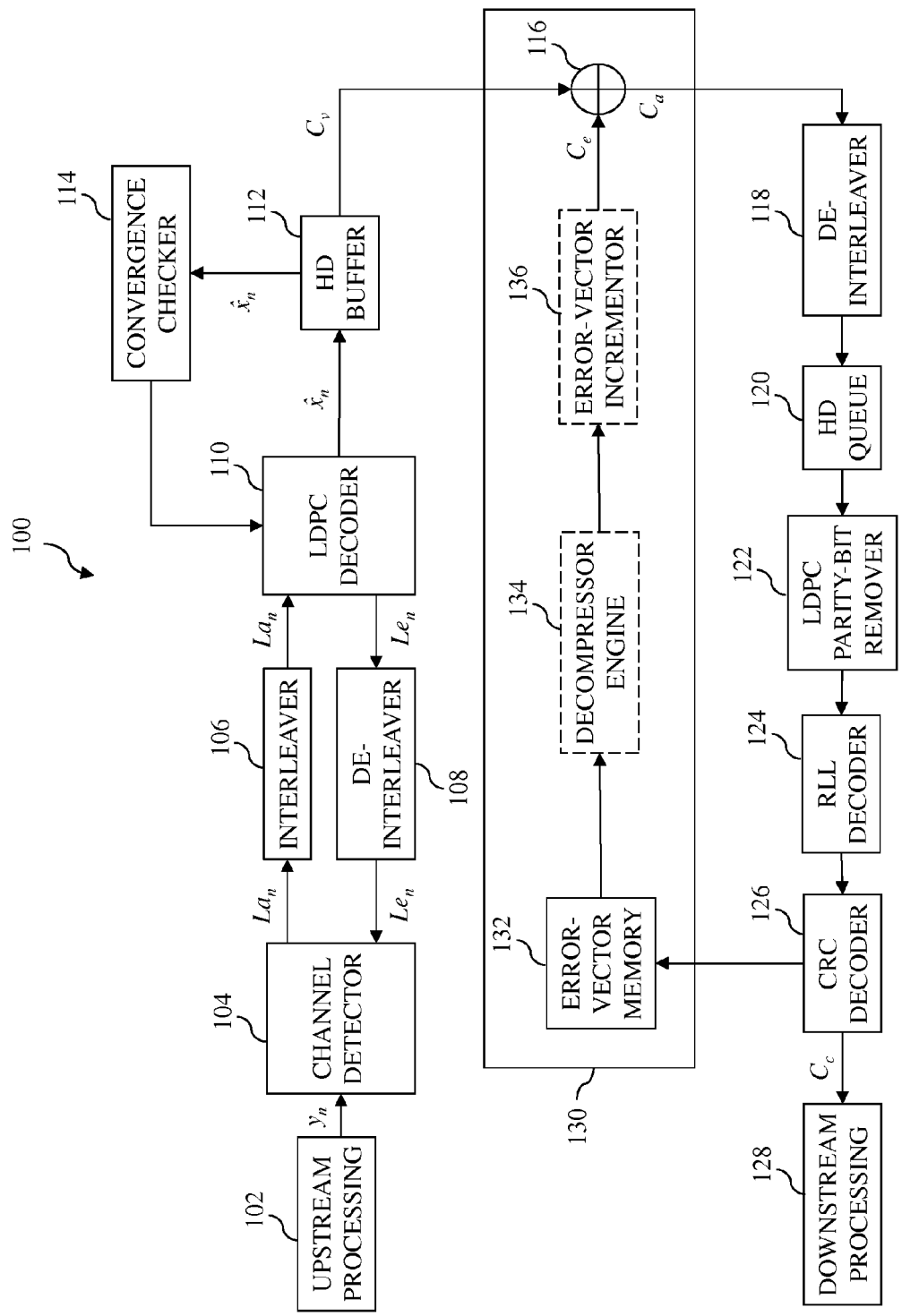
FIG. 1 shows a simplified block diagram of a receiving path of a communications system according to one embodiment of the disclosure.

Referring to FIG. 1, receiving path 100 may be implemented in any communications system suitable for communicating an input data stream over a communications channel (not shown), such as a wireless communications system, a hard-disk drive (HDD) system, or an optical-disk drive system. For example, when implemented in a wireless communications system, receiving path 100 is a receiver, and the communications channel is a wireless transmission medium. When implemented in a hard-disk drive system, the receive path includes the read channel, and the communications channel includes a hard-disk platter.

In general, receiving path 100 receives, or retrieves in the case of an HDD or optical-disk drive system, an encoded codeword from the communications channel. The encoded codeword is a version of an original input data word that is encoded in a transmitting path (not shown) of the communications system using a cyclic-redundancy-check (CRC) encoding scheme, a low-density parity-check (LDPC) encoding scheme, and a run-length limited (RLL) encoding scheme (in the case of an HDD or optical-disk drive system). Receiving path 100 processes the encoded codeword to recover the original input data word that was encoded in the transmitting path.

In particular, the encoded codeword is processed by receiving path 100 using upstream processing 102, which may include processing such as amplification, analog-to-digital conversion, finite-impulse-response (FIR) filtering, equalization, and possibly other processing suitable for preparing encoded codewords for decoding. Samples $y_n$ of the encoded codeword are provided to channel detector 104 in an order, herein referred to as the "user-data order," that corresponds to the order in which the original input data word is received from the user in the transmitting path.

Channel detector 104 implements a suitable channel detection technique, such as Viterbi soft-output detection or maximum a posteriori (MAP) detection, to generate a channel soft-output value $La_n$ (e.g., a log-likelihood ratio (LLR)) corresponding to each bit n of the encoded codeword. As used herein, the term "soft-output value" refers to a value comprising a hard-decision bit (i.e., the most-significant bit) that represents the detector's best guess regarding the nth bit value and one or more confidence value bits (i.e., the least-significant bits) that represent the detector's confidence in the hard decision. The channel soft-output values $La_n$ are provided in the "user-data order" to interleaver 106.

Interleaver 106, together with de-interleavers 108, de-interleaver 118, and corresponding interleavers and de-interleavers (not shown) in the transmitting path, implement an interleaving scheme to reduce the effects that burst errors have on recovering the original input data word when the original input data word is transmitted over a noisy communications channel. Interleaver 106 interleaves the channel soft-output values $La_n$ using a mapping that arranges the soft-output values $La_n$ into an order, herein referred to as the "LDPC order," that corresponds to the order in which soft-output values $La_n$ are processed by LDPC decoder 110. Note that, in this interleaving scheme, the original input data word is received at the transmitter in the "user-data order", interleaved into the LDPC order, low-density parity-check encoded, and de-interleaved before being transmitted. In alternative embodiments of the disclosure, other interleaving schemes may be used. For example, the original input data word may be interleaved at the transmitter into the LDPC order, low-density parity-check encoded, and transmitted in the LDPC order. Then, at the receiver, the received codeword may be low-density parity-check decoded and de-interleaved into the user-data order.

LDPC decoder 110 performs low-density parity-check decoding on the soft-output values $La_n$ in an attempt to recover a valid LDPC-encoded codeword $C_v$. In so doing, LDPC decoder 110 generates a set of updated soft-output values $P_n$, where each value $P_n$ corresponds to the $n^{th}$ bit of the LDPC-encoded codeword, and each value $P_n$ comprises a hard-decision bit $\hat{x}_n$ and a confidence value. The set of updated hard-decision bits $\hat{x}_n$ are stored in hard-decision (HD) buffer 112, and convergence checker 114 performs a convergence check on the set of updated hard-decision bits $\hat{x}_n$.

The convergence check is performed by multiplying a vector $\hat{x}$, formed from a set of hard-decision bits $\hat{x}_n$, by the transpose $H^T$ of the LDPC parity-check matrix (i.e., H-matrix) used by LDPC decoder 110. The resulting product is a vector, often referred to as the syndrome, and each bit of the syndrome corresponds to one row (i.e., check node) of the LDPC parity-check matrix. If one or more elements of the resulting syndrome are equal to one, then LDPC decoder 110 has not converged on a valid codeword $C_v$. Each element of the syndrome that has a value of one is considered an unsatisfied check node, and each element of the syndrome that has a value of zero is either (i) a satisfied check node or (ii) a mis-satisfied check node (i.e., a check node that falsely shows as satisfied).

If convergence checker 114 determines that LDPC decoder 110 has not yet converged on a valid codeword $C_v$, then another LDPC-decoding iteration may be performed to attempt to converge on a valid codeword $C_v$. If LDPC decoder 110 does not converge on a valid codeword $C_v$ (e.g., after a specified number of LDPC-decoding iterations), then further processing may be necessary to recover a valid codeword $C_v$. For example, the original user data word may be retransmitted or channel detector 104 may perform another iteration of channel detection on the received codeword using extrinsic soft-output values $Le_n$ received from LDPC decoder 110. The extrinsic soft-output values $Le_n$ may be generated by LDPC decoder 110 for each bit n of the LDPC-encoded codeword as shown in Equation (1) below:

$$Le_n = P_n - La_n. \quad (1)$$

The extrinsic soft-output values $Le_n$ are de-interleaved by de-interleaver 108, which uses a de-interleaving mapping that is the inverse of the interleaving mapping used by interleaver 106. The de-interleaved extrinsic soft-output values $Le_n$ are provided to channel detector 104, which uses the extrinsic soft-output values $Le_n$ to improve detection. For example, in Viterbi detection, the extrinsic soft-output values $Le_n$ are used to improve the branch-metric calculation.

Referring back to convergence checker 114, if each element of the resulting syndrome is equal to zero (i.e., the convergence check passes), then LDPC decoder 110 has converged on a valid LDPC-encoded codeword $C_v$. Passing the convergence check means only that the vector $\hat{x}$ of hard-decisions bits $\hat{x}_n$ is a valid codeword $C_v$. It does not necessarily mean that the valid codeword $C_v$ is the codeword that was communicated by the transmitting path (i.e., the correct LDPC-encoded codeword $C_c$). It is possible for LDPC decoder 110 miscorrect the codeword such that a valid LDPC-encoded codeword $C_v$ is generated that is not the correct LDPC-encoded codeword $C_c$ (i.e., generate a miscorrected codeword). In such a case, the convergence check generates a syndrome in which there are no unsatisfied check nodes in the vector $\hat{x}$, but there are one or more mis-satisfied check nodes. Note that, the convergence check does not discriminate between correct LDPC-encoded codewords $C_c$ and miscorrected codewords.

When LDPC decoder 110 converges on a valid LDPC-encoded codeword $C_v$, receiving path 100 processes the codeword to determine whether or not the valid LDPC-encoded codeword $C_v$ is the correct codeword $C_c$. The valid LDPC-encoded codeword $C_v$ is provided to combiner 116, which adds an error vector $C_e$ to the valid codeword $C_v$ to provide an adjusted valid codeword $C_a$ to de-interleaver 118. When the valid LDPC-encoded codeword $C_v$ is first provided to combiner 116 the error vector $C_e$ is initialized to zero, such that the adjusted codeword $C_a$ is equal to the valid codeword $C_v$.

De-interleaver 118 implements the same de-interleaving mapping as de-interleaver 108 to arrange the codeword in the user-data order. The resulting de-interleaved codeword is stored in hard-decision queue 120, LDPC parity-bit remover 122 removes the LDPC parity bits from the de-interleaved codeword, and RLL decoder 124 performs run-length-limited decoding on the remaining bits to generate an RLL-decoded codeword.

CRC decoder 126 performs a cyclic-redundancy check on the RLL-decoded codeword to determine whether or not the RLL-decoded codeword is the correct codeword $C_c$. The cyclic-redundancy check is performed by dividing the RLL-decoded codeword by a keyword that is known a priori by the receiver. The remainder of the division process is compared to r cyclic-redundancy-check bits that are appended to the original user data word by the transmission path before transmission. If the remainder is equal to the r cyclic-redundancy-check bits, then the cyclic-redundancy check has passed indicating that LDPC decoder 110 has converged on the correct codeword C. The correct codeword $C_c$ is then provided to downstream processing 128, which may include, for example, a controller or a read and write interface.

If the remainder is not equal to the r cyclic-redundancy-check bits, then the cyclic-redundancy check has failed, indicating that LDPC decoder 110 has converged on a valid codeword $C_v$ that is an incorrect codeword C (i.e., $C_v$=C) (i.e., the valid codeword $C_v$ has one or more mis-satisfied check nodes). Rather than repeating one or more of (i) transmission of the encoded codeword over the communications channel, (ii) channel detection, and (iii) LDPC decoding, receiving path 100 implements an error-detection list-decoding method in an attempt to correct the miscorrection of LDPC decoder 110, and consequently, recover the correct codeword $C_c$.

To perform the error-detection list-decoding method, receiving path 100 implements a codeword adjuster 130 that adjusts the incorrect codeword C stored in hard-decision buffer 112 in an attempt to generate the correct codeword $C_c$ (i.e., correct the miscorrection mistakes of LDPC decoder 110). Upon initiating the error-detection list-decoding method, codeword adjuster 130 selects a first error vector $C_e$ from a list of candidate error vectors (discussed in further detail below). Combiner 116 of codeword adjuster 130 applies exclusive disjunction (i.e., XOR logic) to (i) the incorrect LDPC-encoded codeword C stored in hard-decision buffer 112 and (ii) the selected error vector $C_e$ to generate an adjusted codeword $C_a$ (i.e., $C_a = C + C_e$).

The adjusted codeword $C_a$ is processed by de-interleaver 118, HD queue 120, LDPC parity-bit remover 122, RLL decoder 124, and CRC decoder 126 as described above. If the adjusted codeword $C_a$ passes the cyclic-redundancy check, then the adjusted codeword $C_a$ is the correct codeword $C_c$ that was transmitted by the transmitting path (i.e., $C_a = C_c$) and is output to downstream processing 128. If the adjusted codeword $C_a$ does not pass the cyclic-redundancy check, then (i) codeword adjuster 130 may adjust the incorrect codeword C a subsequent time by applying a subsequent error vector $C_e$ from the list of candidate error vectors to the incorrect codeword C to generate a subsequent adjusted codeword $C_a$ and (ii) the subsequent adjusted codeword $C_a$ may be processed as described above to perform a cyclic-redundancy check.

This process is repeated until the either (i) a subsequent adjusted codeword $C_a$ passes the cyclic-redundancy check or (ii) the list-decoding method times out (e.g., after a specified number of error vectors $C_e$ or all of the error vectors $C_e$ in the list have been attempted), whichever occurs sooner. If the list-decoding method times out without identifying the correct codeword $C_c$, then further processing may be necessary to recover the original input data word such as re-transmitting the original input data word.

Codeword adjuster 130 implements the list of candidate error vectors $C_e$ using error vector memory 132, which itself may be implemented using, for example, random-access memory (RAM) or read-only memory (ROM). The list of candidate error vectors $C_e$ is pre-determined using computer simulations or analysis tools for the particular LDPC parity-check matrix used by LDPC decoder 110 and may be stored in its entirety in error-vector memory 132. However, the size of the list may be relatively large. Therefore, various techniques may be used by codeword adjuster 130 to reduce the size of the list, and consequently, the size of memory 132.

For example, codeword adjuster 130 may optionally implement decompressor engine 134 as indicated by the dashed lines around this component. In such a case, error-vector memory 132 stores compressed versions of the error vectors $C_e$, and the compressed versions are subsequently decompressed by decompressor engine 134 before being provided to combiner 116. The error vectors $C_e$ may be compressed using any suitable compression technique that reduces the amount of memory needed to store the vectors such as (without limitation) delta compression, wherein differences (i.e., deltas) between sequential values are stored rather than the values themselves, and column scan compression.

As another example, codeword adjuster 130 may optionally implement error-vector incrementor 136 as indicated by the dashed lines around this component. Suppose that the low-density parity-check matrix implemented by LDPC decoder 110 is quasi-cyclic, meaning that the matrix comprises a plurality of z×z sub-matrices, where each sub-matrix is either an identity matrix or obtained by cyclically shifting an identity matrix. In such a case, z error vectors $C_e$ can be obtained from a single error vector $C_e$ by cyclically shifting that error vector. Thus, the number of error vectors stored in error-vector memory 132 can be reduced by a factor of z, and error-vector incrementor 136 can be used to generate z–1 other error vectors $C_e$ from each error vector $C_e$ stored in error-vector memory 132 by cyclically shifting the error vector $C_e$. Note that codeword adjuster 130 may optionally implement either or both of decompressor engine 134 and error-vector incrementor 136.

When selecting error vectors $C_e$, codeword adjuster 130 attempts to find an error vector $C_e$ in the list of candidate error vectors that is equal to the difference between the correct LDPC-encoded codeword $C_c$ and the incorrect LDPC-encoded codeword C (i.e., $C_e = C_c - C$). The error vectors $C_e$ may be selected from the candidate list randomly or using a more targeted methodology that aims to find the proper error vector $C_e$ relatively quickly. For example, according to one embodiment of the disclosure, the error vectors $C_e$ in the list may be (i) ranked in terms of their probability of occurrence using, for example, importance sampling, (ii) sorted in an order from most-likely to least-likely to occur, and (iii) selected in the order that they are sorted. As a general trend, miscorrections are more likely to occur as a result of error vectors $C_e$ having smaller binary weights than error vectors having larger binary weights, where a binary weight is the number of ones in the error vector.

Note that the steps of the list-decoding method described above need not necessarily be performed in sequence. For example, HD queue 120 may comprise more than one slot for storing more than one adjusted codeword $C_a$. While LDPC parity-bit remover 122, RLL decoder 124, and CRC decoder 126 are processing a current adjusted codeword $C_a$, codeword adjuster 130 could generate one or more subsequent adjusted codewords $C_a$, assuming that HD queue 120 has one or more open slots for storing the one or more subsequent adjusted codewords $C_a$. Generating subsequent adjusted codewords $C_a$ while a current adjusted codeword $C_a$ is being processed by LDPC parity-bit remover 122, RLL decoder 124, and CRC decoder 126 lessens latency incurred by performing the list-decoding method.

Although error-detection list-decoding has been described above relative to its use with low-density parity-check encoding/decoding, embodiments of the disclosure are not so limited. According to alternative embodiments of the disclosure, error-detection list-decoding may be used with suitable error-correction encoding/decoding schemes other than low-density parity-check encoding/decoding, such as (without limitation) turbo codes and Reed-Solomon codes.

Further, although error-detection list-decoding has been described above relative to its use with cyclic-redundancy check error-detection, embodiments of the disclosure are not so limited. According to alternative embodiments of the disclosure, other suitable error-detection schemes may be employed, such as error-detection schemes that use a hash function.

Yet further, although an embodiment is shown in which codeword adjuster 130 adjusts incorrect codewords before removal of the parity bits by LDPC-parity-bit remover 122, embodiments of the disclosure are not so limited. According to alternative embodiments of the disclosure, codeword adjuster 130 could adjust codewords after removal of the parity bits. For example, LDPC-parity-bit remover 122 could be located before combiner 116 such that error vectors are combined with codewords after the LDPC parity bits are removed.

According to further embodiments of the disclosure, receiving path 100 may be implemented using an interleaving/de-interleaving scheme other than that shown in FIG. 1 or with no interleaving/de-interleaving scheme at all. Further, receiving path 100 is implemented without RLL decoder 124, when RLL encoding is not used in the transmitting path.

Figure 2:
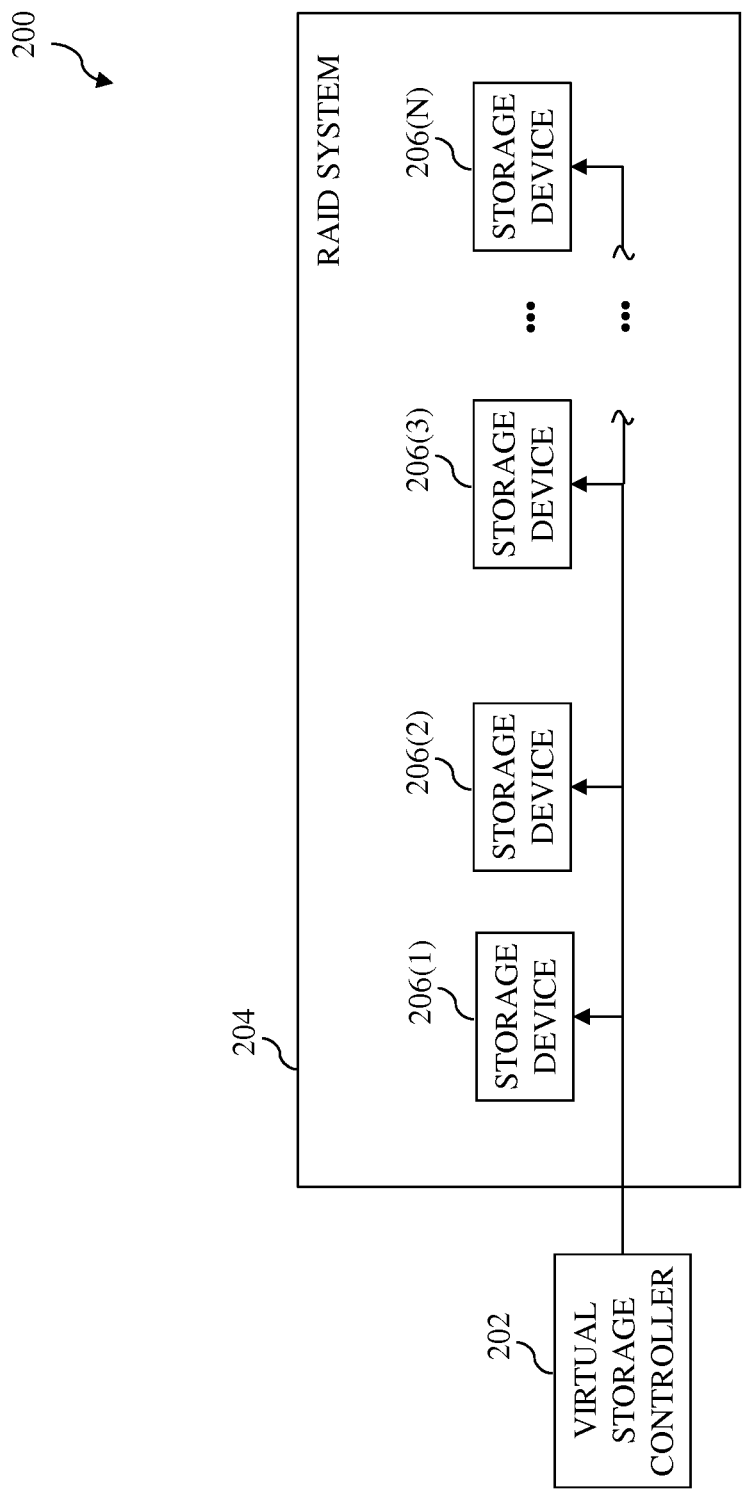
FIG. 2 shows a simplified block diagram of a virtual storage system according to one embodiment of the disclosure.

Multiple device-based storage devices 206 may be incorporated into a virtual storage system 200 as illustrated in FIG. 2. The virtual storage system 200, also referred to as a storage virtualization system, illustratively comprises a virtual storage controller 202 coupled to a RAID system 204, where RAID denotes Redundant Array of Independent (Storage) Devices. The RAID system more specifically comprises N distinct storage devices denoted 206(1), 206(2), 206(3), . . . 206(N), one or more of which are configured to include circuitry and associated storage management circuitry as disclosed herein. These and other virtual storage systems comprising one or more HDD or one or more storage devices such as solid state drives or a combination thereof, are considered embodiments of the invention. A host processing device may also be an element of a virtual storage system, and may incorporate the virtual storage controller 202.

Embodiments of the disclosure may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

Embodiments of the disclosure can be embodied in the form of methods and apparatuses for practicing those methods. Embodiments of the disclosure can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Embodiments of the disclosure can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus for decoding an encoded codeword, the apparatus comprising:
    an error-correction decoder adapted to decode the encoded codeword to generate a valid codeword;
    an error-detection decoder configured to determine whether or not the valid codeword is a correct codeword; and
    a codeword adjuster configured to adjust, if the error-detection decoder determines that the valid codeword is not the correct codeword, the valid codeword to generate an adjusted valid codeword, wherein the error-detection decoder is further configured to determine whether or not the adjusted valid codeword is the correct codeword, wherein the codeword adjuster comprises:
        memory configured to store a list of error vectors; and
        a combiner configured to apply an initial error vector in the list to the valid codeword to generate the adjusted valid codeword.

2. The apparatus of claim 1, wherein the error-detection decoder comprises a cyclic-redundancy-check decoder.

3. The apparatus of claim 1, wherein:
    the memory stores a compressed version of the initial error vector; and
    the codeword adjuster further comprises a decompressor engine configured to decompress the initial error vector before the combiner applies the initial error vector to the valid codeword.

4. The apparatus of claim 1, wherein the codeword adjuster further comprises a codeword incrementor configured to increment the initial error vector to generate one or more additional error vectors not stored in the memory.

5. The apparatus of claim 1, wherein the error-correction decoder comprises a low-density parity-check decoder.

6. The apparatus of claim 1, wherein the apparatus is a redundant array of independent storage devices.

7. The apparatus of claim 6, wherein the redundant array of independent storage devices comprises at least one hard-disk drive.

8. The apparatus of claim 6, wherein the redundant array of independent storage devices comprises at least one solid state drive.

9. A method for decoding an encoded codeword, the method comprising:
    (a) performing an error-correction decoding on the encoded codeword to generate a valid codeword;
    (b) performing error-detection decoding on the valid codeword to determine whether or not the valid codeword is a correct codeword;
    (c) adjusting, if step (b) determines that the valid codeword is not the correct codeword, the valid codeword to generate an adjusted valid codeword, wherein step (c) comprises:
        (c1) selecting an initial error vector from a list of candidate error vectors stored in memory; and
        (c2) applying the initial error vector to the valid codeword to generate the adjusted valid codeword; and
    (d) performing error-detection decoding on the adjusted valid codeword to determine whether or not the adjusted valid codeword is the correct codeword.

10. The method of claim 9, wherein the error-detection decoding comprises cyclic-redundancy-check decoding.

11. The method of claim 9, wherein:
    the memory stores a compressed version of the initial error vector; and
    step (c1) further comprises decompressing the initial error vector before step (c2).

12. The method of claim 9, wherein step (c1) further comprises cyclically shifting the initial error vector to generate one or more additional error vectors not stored in the memory.

13. The method of claim 9, wherein the error-correction decoding comprises low-density parity-check decoding.

14. The apparatus of claim 1, wherein:
    the error vectors in the list are (i) ranked in terms of their probability of occurrence and (ii) sorted in an order from most-likely to least-likely to occur; and
    the codeword adjuster selects the error vectors in the order that they are sorted.

15. The apparatus of claim 1, wherein the codeword adjuster selects the error vectors in the list randomly.

16. The method of claim 9, wherein:
    the error vectors in the list are (i) ranked in terms of their probability of occurrence and (ii) sorted in an order from most-likely to least-likely to occur, and
    step (c1) comprises selecting the error vectors in the order that they are sorted.

17. The method of claim 9, wherein step (c1) comprises selecting the error vectors in the list randomly.

* * * * *